United States Patent [19]

Ueno et al.

[11] Patent Number: 5,236,515
[45] Date of Patent: Aug. 17, 1993

[54] CLEANING DEVICE

[75] Inventors: Kinya Ueno, Nirasaki; Yoshio Kumagai, Kofu, both of Japan

[73] Assignee: Tokyo Electron Limited, Tokyo, Japan

[21] Appl. No.: 792,919

[22] Filed: Nov. 15, 1991

[30] Foreign Application Priority Data

Nov. 17, 1990 [JP] Japan .................................. 2-312475

[51] Int. Cl.⁵ .................................................. B08B 3/04
[52] U.S. Cl. .................................... 134/25.4; 134/34; 134/155; 134/186; 134/902
[58] Field of Search ............... 134/186, 155, 200, 902, 134/82, 25.4, 34; 239/504, 524

[56] References Cited

U.S. PATENT DOCUMENTS

| 1,059,845 | 4/1913 | Delahunty | 68/181 R |
| 3,404,845 | 10/1968 | Schmeling et al. | 134/182 X |
| 3,543,776 | 12/1970 | Layton | 134/182 |
| 4,092,176 | 5/1978 | Kozai et al. | 134/186 |
| 4,753,258 | 6/1988 | Aigo | 134/186 |
| 4,777,970 | 10/1988 | Kusumara | 134/902 |
| 4,869,278 | 9/1989 | Bran | 134/902 |
| 4,902,350 | 2/1990 | Steck | 134/902 |
| 4,955,402 | 9/1990 | Miranda | 134/186 |
| 4,955,402 | 9/1990 | Miranda | 134/186 X |
| 4,967,777 | 11/1990 | Takayama et al. | 134/186 |
| 5,025,280 | 6/1991 | Lamb et al. | 134/902 |
| 5,069,235 | 12/1991 | Vetter et al. | 134/186 X |

FOREIGN PATENT DOCUMENTS

| 520433 | 3/1955 | Italy | 68/183 |
| 64-37024 | 2/1989 | Japan | 134/902 |
| 170758 | 11/1921 | United Kingdom | 134/102.1 |
| 685399 | 1/1953 | United Kingdom | 68/183 |

Primary Examiner—Frankie L. Stinson
Attorney, Agent, or Firm—Oblon, Spivak, McClelland, Maier & Neustadt

[57] ABSTRACT

A cleaning device comprises a cleaning tub, holding means for holding a plurality of objects substantially vertically at regular intervals, cleaning solution supplying means for supplying a cleaning solution to the cleaning tub through the bottom thereof, and distributing means for uniformly distributing the cleaning solution to the objects.

22 Claims, 5 Drawing Sheets

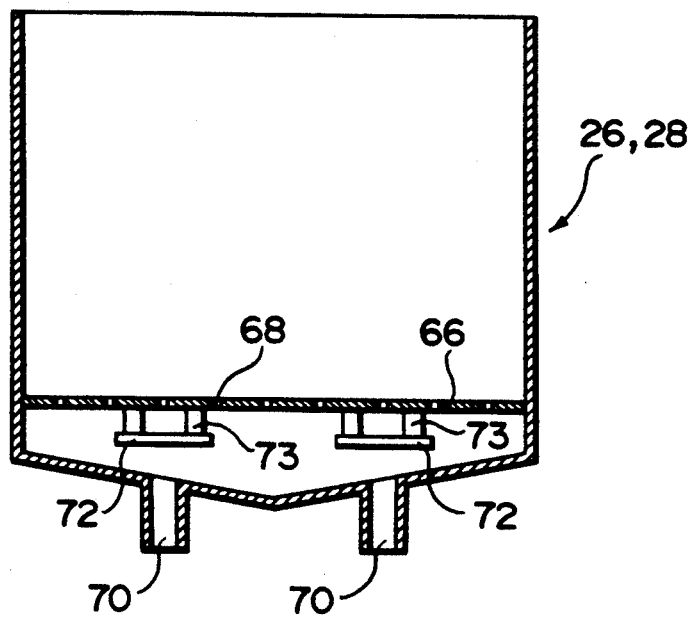
F I G. 6
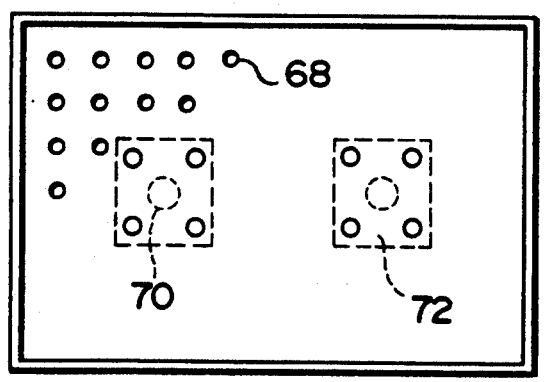
F I G. 7

CLEANING DEVICE

BACKGROUND OF THE INVENTION

1. Field of the Invention

This invention relates to a cleaning device, and more particularly to a cleaning device to which a cleaning solution is supplied through the bottom of a cleaning tub.

2. Description of the Related Art

A cleaning device for use in a semiconductor wafer manufacturing apparatus is known in this field.

The cleaning device has a structure suitable for a cleaning treatment using demineralized water and chemicals such as ammonia water. In a cleaning treatment, a plurality of semiconductor wafers are arranged vertically at regular intervals of, for example, 1 cm. In this state, a cleaning solution is supplied to a cleaning treatment tub through the bottom thereof. As a result, the level of the cleaning solution rises among the semiconductor wafers, cleaning the surfaces thereof.

In a typical cleaning device, since semiconductor wafers are arranged at regular, relatively short intervals, the cleaning solution supplied through the bottom of the cleaning treatment tub concentrates near the solution supplying port, and is not supplied to the surfaces of all of the wafers at a constant rate. Therefore, the wafers, which are subjected to batch processing in units of a predetermined number, cannot be satisfactorily cleaned.

SUMMARY OF THE INVENTION

It is an object of the present invention to provide a cleaning device in which a cleaning solution can be uniformly supplied to the surfaces of objects in a cleaning tub through the bottom thereof, with the result that the objects are satisfactorily and uniformly cleaned.

The object is achieved by a cleaning device comprising a cleaning tub, holding means for holding a plurality of objects substantially vertical at regular intervals, cleaning solution supplying means for supplying a cleaning solution to the cleaning tub through the bottom thereof, and distributing means for uniformly distributing the cleaning solution to the objects.

According to the present invention, since a cleaning solution is supplied to the cleaning tub through the bottom such that the level of the solution rises at a steady rate, objects which are subjected to batch processing are cleaned satisfactorily and uniformly.

The distributing means may be a current regulating plate having a number of small holes formed in the bottom of the cleaning tub, through which a cleaning solution is supplied to objects in the tub. Since the solution is diffused through the current regulating plate, i.e., flows through the small holes of the plate toward the objects without concentrating in the vicinity of the cleaning solution supplying port, the solution is brought into contact with the surfaces of the objects uniformly and cleans them without irregularity.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIGS. 6 and 7 are a longitudinal sectional view and a plan view showing a modification of the current regulating plate formed in the bottom of the cleaning tub.

DETAILED DESCRIPTION OF THE PREFERRED EMBODIMENTS

An embodiment of the present invention will now be described with reference to the accompanying drawings.

The embodiment relates to a cleaning device for use in a semiconductor wafer manufacturing step.

Figure 1:
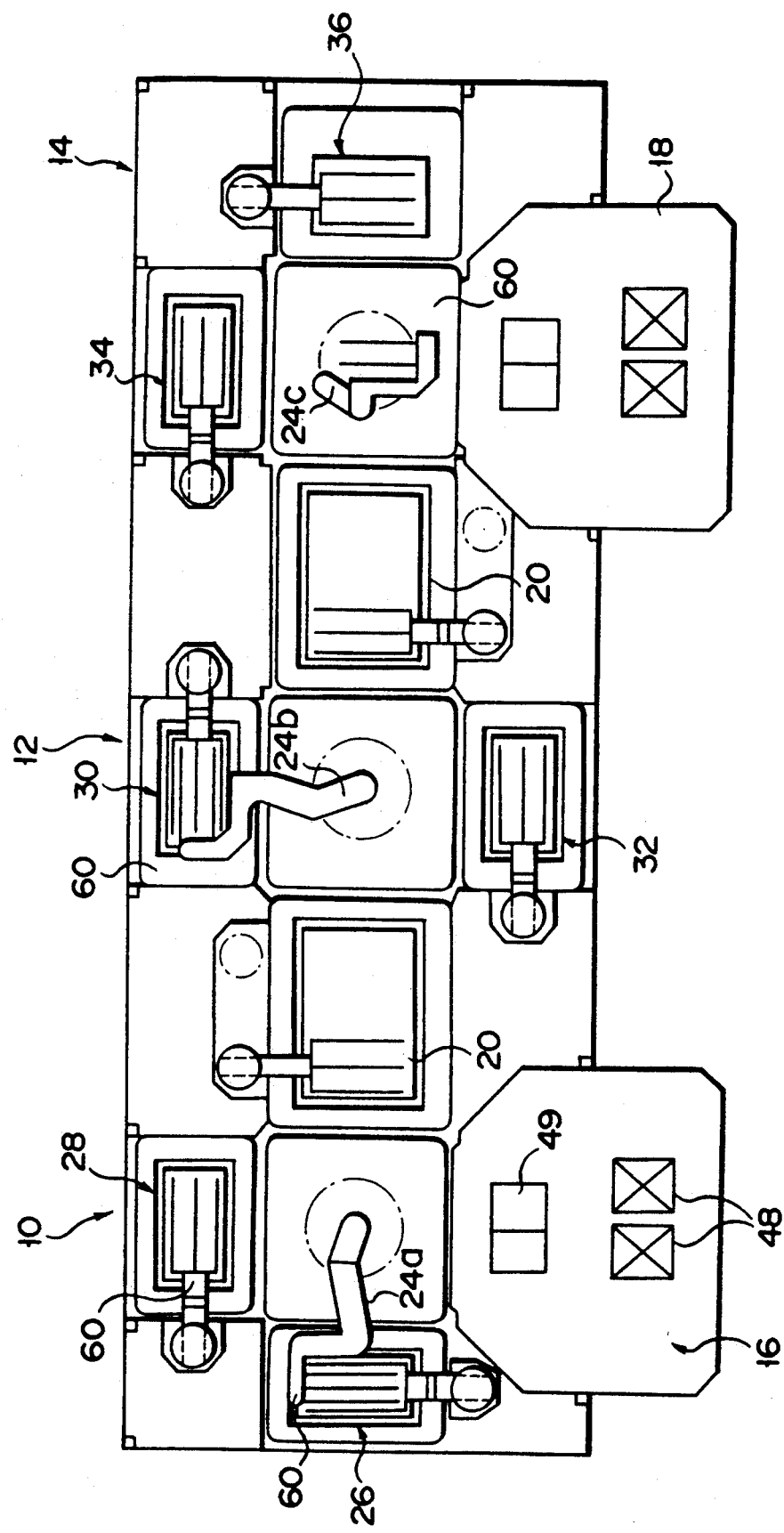
FIG. 1 is a schematic plan view showing a cleaning device according to an embodiment of the present invention.

As is shown in FIG. 1, a semiconductor wafer cleaning device of this embodiment is constituted by three cleaning units 10, 12 and 14. The cleaning unit 10 provided on the wafer loading side is connected to a loading unit 16, and the cleaning unit 14 on the wafer unloading side is connected to an unloading unit 18. Transfer units 20 are connected between the cleaning units 10 and 12 and between the cleaning units 12 and 14.

A first rotational transfer arm 24a for transferring semiconductor wafers is mounted on the central portion of the cleaning unit 10 on the wafer loading side. Surrounding the first rotational transfer arm 24a, a first cleaning tub 26 is arranged on the left thereof and a second cleaning tub 28 is arranged across from the loading unit 16.

In this embodiment, the first cleaning tub 26 serves as a chemical treatment tub for treating wafers with ammonia, and the second cleaning tub 28 serves as a quick damp rinse (QDR) tub for cleaning wafers with water.

A second rotational transfer arm 24b is mounted on the a central portion of the intermediate cleaning unit 12. The transfer units 20 are positioned on either side of the second rotational transfer arm 24b, and third and fourth cleaning tubs 30 and 32 are positioned at the front and back thereof. The third cleaning tub 30 serves as a chemical treatment tub for treating wafers with hydrofluoric acid, and the fourth cleaning tub 32 serves as a overflow treatment tub for cleaning wafers with water.

A third rotational transfer arm 24c is mounted on the central portion of the cleaning unit 14 on the wafer unloading side. Surrounding the third rotational transfer arm 24c, a fifth cleaning tub 34 is arranged across from the unloading unit 18 and a dry treatment tub 36 is arranged on the right of the rotational transfer arm 24c.

The cleaning tub 34 serves as a final rinse tub for cleaning wafers.

In the cleaning device of the above-described embodiment, 25 semiconductor wafers 22 are disposed on each of two carriers 48 and transferred to the loading unit 16. Orientation flat of the semiconductor wafers 2 is achieved by an orientation adjusting mechanism (not shown) on the loading unit 16. The semiconductor wafers 22 are drawn up by a draw-up mechanism and set on a pickup stage 49.

The first rotational transfer arm 24a picks up the semiconductor wafers 22 from the loading unit 16. The semiconductor wafers 22 are transferred to the first cleaning tub 26 and cleaned therein, then transferred from the first cleaning tub 26 to the second cleaning tub 28 and to the transfer unit 20 in sequence.

Then, the semiconductor wafers 22 are transferred in sequence to the third and fourth cleaning tubs 30 and 32 and the transfer unit 20 by the second transfer arm 24b in the intermediate treatment unit 12, then the fifth cleaning tub 34 and the dry treatment tub 36 by the second transfer arm 24b in the intermediate treatment unit 12 and the third rotational transfer arm 24c in the treatment unit 14 on the wafer unloading side. After the wafers are cleaned and dried in these tubs, they are transferred to the unloading unit 18, divided into two, loaded onto the two carriers 48, and unloaded from the cleaning device.

Figure 3:
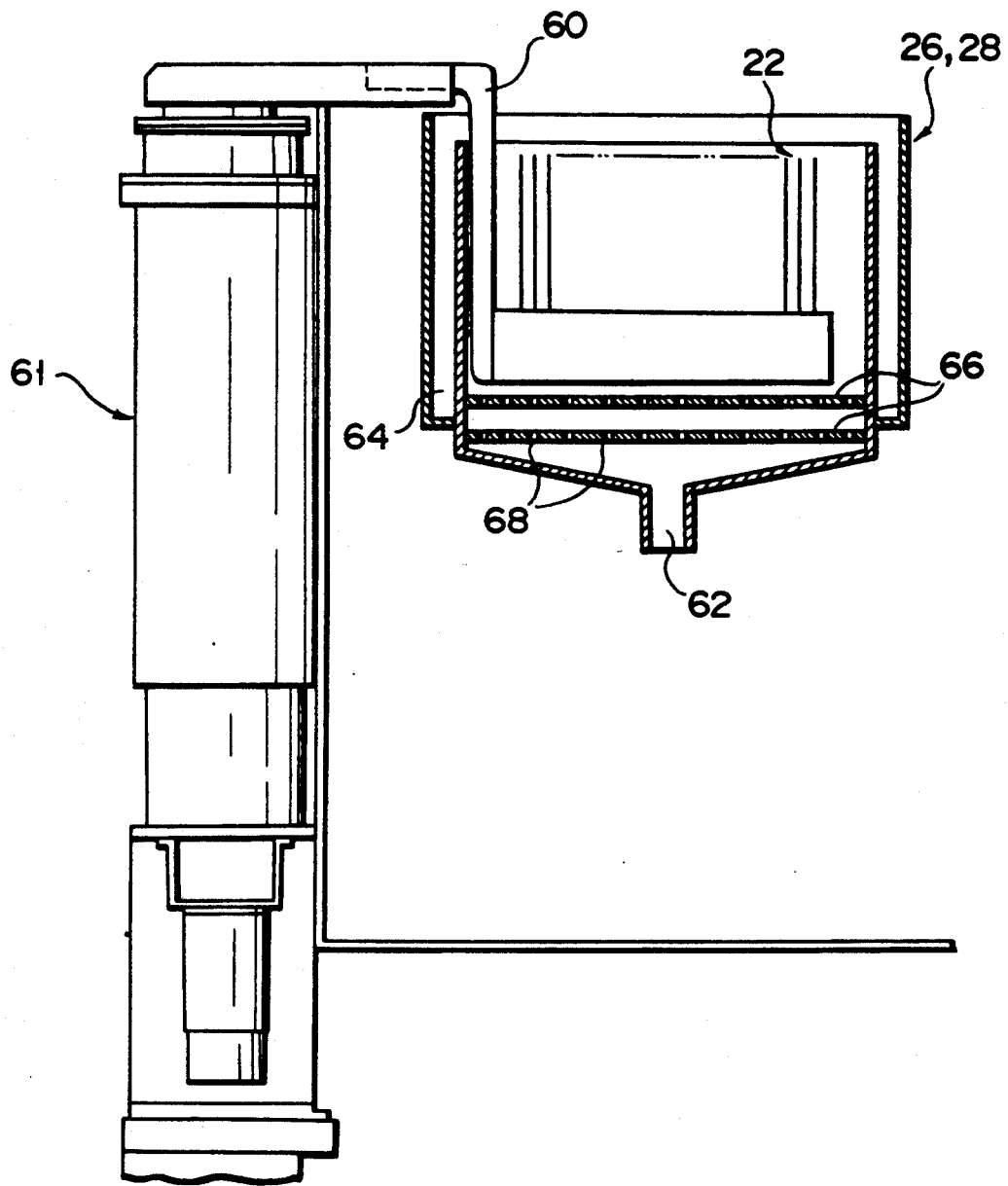
FIG. 3 is a partial schematic sectional view showing a cleaning tub and the arm driving mechanism shown in FIG. 1.

The first cleaning tub 26 for ammonia treatment and the second cleaning tub 28 for QDR treatment with demineralized water both have the structure shown in FIG. 3. More specifically, a chemical-resistant boat 60 holds 50 semiconductor wafers 22 at regular intervals of, for example, 1 cm. A treatment solution supplying port 62 for supplying ammonia water or demineralized water is formed in the bottom of the tub. A dummy wafer may be arranged on at least one end of the set of the wafers, where the treatment surface of the dummy wafer is exposed, or a monitor wafer may be arranged at a suitable position within the set of wafers. A cylinder 61 is attached to the boat 60 and moves it up and down.

Figure 2:
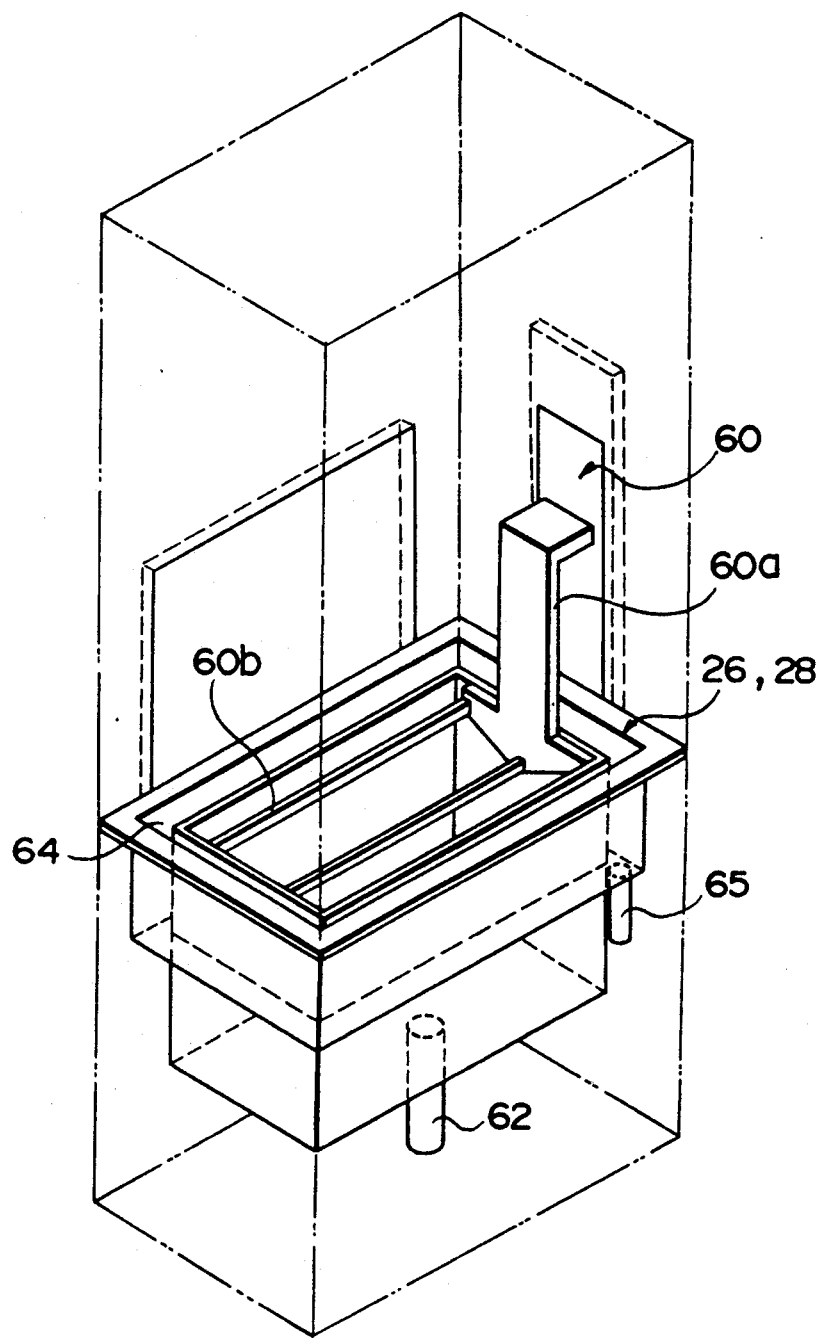
FIG. 2 is a perspective view showing one of the cleaning tubs shown in FIG. 1.

As is shown in FIG. 2, the boat 60 is constituted by an arm 60a and three claws 60b extending from and perpendicular to one end of the arm 60a. Wafers 22 are vertically held by the three claws 60b. A drain 64 surrounds the cleaning tub (26, 28) to store the cleaning solution which is supplied through the solution supplying port 62 and overflows the cleaning tub. The drain 64 has a side wall which is higher than the wall of the cleaning tub. The capacity of the drain 64 is sufficient to store the cleaning solution which overflows the cleaning tub in a state where the boat 60, fully loaded with semiconductor wafers 22, is immersed in the tub. The drain 64 has a discharging port 65. The amount of the cleaning solution discharged from the discharging port 65 per second is greater than that overflowing the cleaning tub per second. In this embodiment, the cleaning solution is discharged from the port 65 at a rate of at least 20 l/sec.

Figure 4:
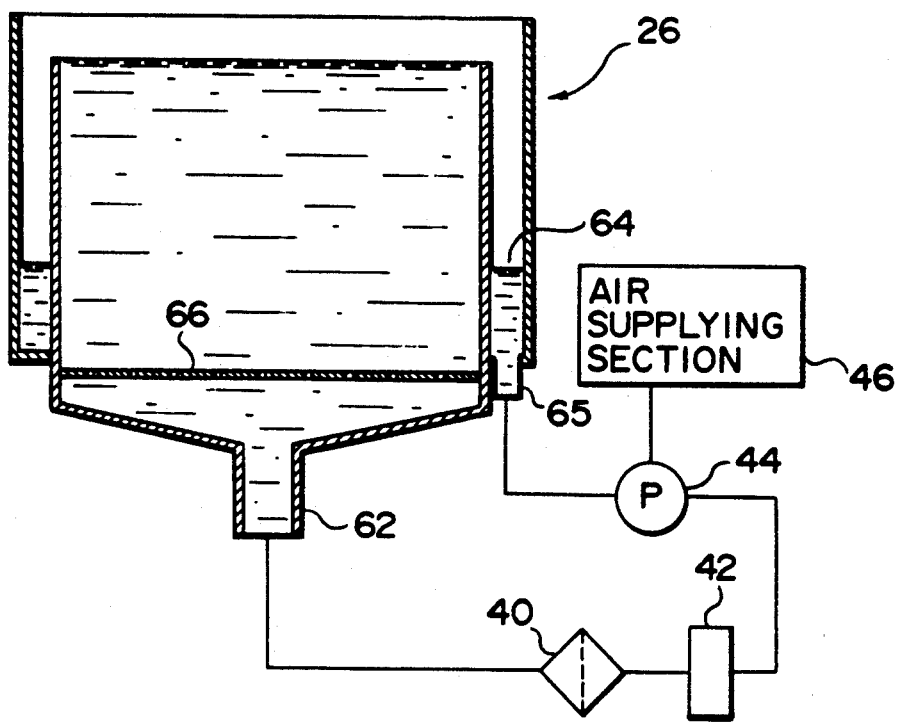
FIG. 4 is a fluid circuit diagram showing the structure of a cleaning tub for use in cleaning with chemicals.

FIG. 4 shows the first cleaning tub 26 for use in a treatment employing, for example, ammonia solution. The solution supplying port 62 of the cleaning tub 26 is connected via a filter 40 and a ripple-preventing damper 42 to a bellows pump 44 which is connected to the discharging port 65. Hence, the ammonia solution stored in the drain 64 is returned to the solution supplying port 62 by means of the bellows pump 44. The bellows pump 44 is connected to an air supplying section 46 and driven by compressed air supplied therefrom. The output of the bellows pump 44 is controlled by changing the pressure of the compressed air.

Figure 5:
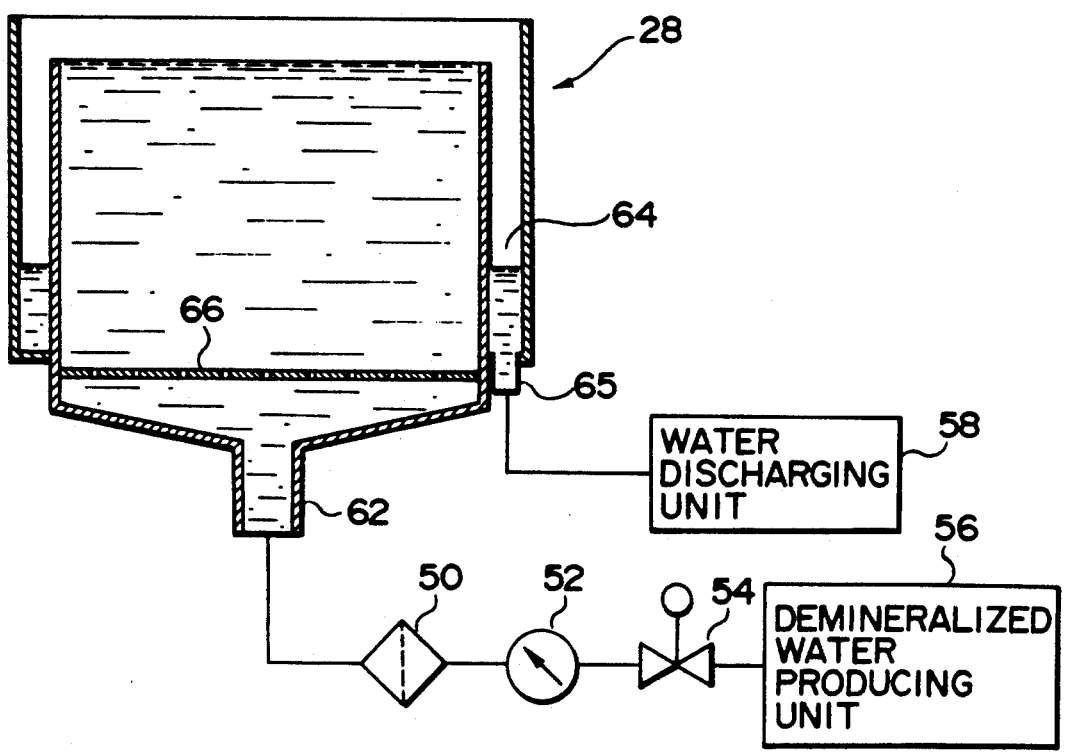
FIG. 5 is a fluid circuit diagram showing the structure of a cleaning tub for use in cleaning with demineralized water.

FIG. 5 shows the second cleaning tub 28 serving as a demineralized-water tub for use in, for example, QDR treatment. The solution supplying port 62 of the second cleaning tub 28 is connected via a filter 50 to a flow meter 52 and an air-driven valve 54. The air-driven valve 54 is connected to a demineralized water producing unit 56 provided in the factory.

The discharging port 65 of the drain 6 surrounding the second cleaning tub 28 is connected to a water discharging unit 58. The demineralized water produced by the unit 56 is supplied to the cleaning tub 28 via the air-driven valve 54, the flow meter 52, and the filter 50. The excess water stored in the drain 64 is discharged to the water discharging unit 58.

As is shown in FIG. 3, upper and lower current regulating plates 66, for example, are placed in the bottom portion of the cleaning tub (26, 28) such that the level of the cleaning solution in the tub rises at a rate of 0.5 cm/sec or higher when the cleaning solution is supplied through the port 62 into the tub. The current regulating plates 66, made of quartz, a PFA resin, Teflon, or the like, have a number of small through-holes 68 for sufficiently diffusing and regulating the cleaning solution. The means for raising the level of the cleaning solution at the above-mentioned rate is not limited to the current regulating plates 66 but may be another flow distributing means.

In this embodiment, the current regulating plates 66 are formed such that a cleaning solution is supplied through the supplying port 62 into the tub at a rate of at least 10 l/min and the level of the cleaning solution constantly rises at a rate of at least 0.2 cm/sec. i.e., each of the current regulating plates 66 has small holes 68 of a diameter of 1.5 mm arranged at a pitch of 4.8 mm. The number of the small holes and the pitch may differ between upper and lower current regulating plates 66. The diameter of the holes and the pitch may also be varied between central and peripheral portions of the current regulating plate. Further, there may be one current regulating plate 66, or three or more, in consideration of the diffusion and solution supplying rates.

An operation of the cleaning device according to the above-described embodiment will now be described.

First, a cleaning solution is supplied under a predetermined pressure to the cleaning tub (26, 28) through the solution supplying port 62 formed in the bottom of the cleaning tub (26, 28).

When the solution begins to overflow the cleaning tub (26, 28), wafers 22 held by the boat 60 are immersed into the tub.

Then, the cleaning solution is supplied again to the cleaning tub (26, 28), passes through the number of small holes 68 of the two current regulating plates 66, and is uniformly brought into contact with the surfaces of the semiconductor wafers 22, thereby cleaning them. In other words, the cleaning solution, after passing through the current regulating plates 66, enters the spaces between the wafers, touches the surfaces of the wafers, and removes impurities adhering to the surfaces.

Since the current regulating plates 66 are designed such that the level of the solution rises at a rate of at least 0.2 cm/sec, the cleaning treatment is performed at a satisfactory speed.

The cleaning solution which overflows the cleaning tub (26, 28) is stored in the drain 64 and then discharged through the discharging port 65.

The boat 60 is drawn up from the cleaning tub (26, 28), and the cleaning treatment is completed. A cleaning effect is also obtained when the wafers are drawn up from the cleaning solution.

The diameter and pitch of the small holes 68 of the current regulating plate 66 are not limited to those as in the above embodiment, but can be changed in accordance with conditions in the cleaning tub.

The wafers can be transferred from the first cleaning tub 26 to the second cleaning tub in about 1 seconds. In detail, the wafers are drawn up from the first cleaning tub 26 in about 3 seconds, transferred above the second cleaning tub 28 in about 4 seconds, and immersed in the second cleaning tub 28 in about 3 seconds. The wafers are immersed into the cleaning solution over one second, measured form the moment their lower ends touch the solution to the moment their upper ends sink in the solution. They are drawn up from the solution over one second, measured from the moment their upper ends come out of the solution to the moment their lower ends do so.

FIGS. 6 and 7 show a modification of the above-described current regulating plates. In this modification, current direction changing plates 72 are provided at portions facing cleaning solution supplying ports 70 formed in the bottom portion of the cleaning tub (26, 28). The current direction changing plates 72 are attached to the lower surface of the current regulating plate 66 by four connecting members 73. By virtue of this structure, the flow of demineralized water or chemical solution supplied through the supplying ports 70 is changed by the direction changing plates 72 and distributed uniformly. Therefore, the level of the solution in the tub rises at constant rate.

An acid cleaning solution, an alkali cleaning solution, or demineralized water can be used as the cleaning solution.

Although the above embodiment relates to a device for cleaning semiconductor wafers, the present invention can be applied to a device for cleaning LCD boards, print circuit boards, and the like.

The present invention is not limited to the above embodiment, but can be variously modified without departing from the spirit of the invention.

What is claimed is:

1. A cleaning device comprising:
   a cleaning tub having a bottom wall;
   holding means for holding a plurality of objects substantially vertical at regular intervals in the cleaning tub;
   cleaning solution supplying means having at least one cleaning solution supplying port formed in a part of the bottom wall of the cleaning tub, for supplying a cleaning solution to said cleaning tub through the bottom wall thereof; and
   distributing means for uniformly distributing the cleaning solution to the objects and creating a flow which flows substantially parallel to the surfaces of the objects;
   said distributing means comprising a current regulating plate which is mounted between the objects held by holding means and the bottom wall of the cleaning tub, to separate the cleaning tub into an upper portion and a bottom portion and includes a number of through holes through which the bottom portion of the cleaning tub is communicated with the upper portion thereof, and at least one current direction changing plate provided between the cleaning solution supplying port of said cleaning solution supplying means and at least part of the current regulating plate to partially cover the current regulating plate, and spaced apart from the cleaning solution supplying port of the cleaning solution supplying means and the current regulating plate.

2. A cleaning device according to claim 1, wherein said current regulating plate is made of quartz.

3. A cleaning device according to claim 1, wherein said current regulating plate comprises a number of through-holes having a diameter of 1.5 mm and arranged at a pitch of 4.8 mm.

4. A cleaning device according to claim 1, wherein said cleaning solution supplying means is adapted to supply a cleaning solution to said cleaning tub at a rate of at least 10 l/min.

5. A cleaning device according to claim 1, wherein the cleaning solution is selected from the group consisting of an acid cleaning solution, an alkali cleaning solution and demineralized water.

6. A cleaning device according to claim 1, further comprising:
   drain means, formed on the periphery of said cleaning tub, for storing the cleaning solution which overflows said cleaning tub, said drain means having a capacity greater than the amount of the cleaning solution which overflows said cleaning tub when said holding means holding the object is immersed in the cleaning tub full of the cleaning solution.

7. A cleaning device according to claim 6, further comprising discharging means for discharging the cleaning solution stored in said drain means.

8. A cleaning device according to claim 6, further comprising circulating means for circulating the cleaning solution from said drain means to said cleaning solution supplying means.

9. A cleaning device according to claim 6, wherein said cleaning tub has a peripheral wall and said drain means has a side wall higher than the peripheral wall of said cleaning tub.

10. A cleaning device according to claim 1, wherein said holding means comprises three elongated members arranged parallel to one another, an intermediate member of the three members being positioned lower than the other members on either side thereof so that the objects are held at right angles relative to the members.

11. A cleaning device according to claim 10, wherein said holding means comprises means for supporting and moving said elongated members up and down so that the objects can be immersed in and lifted out of the cleaning solution in said cleaning tub.

12. A cleaning device according to claim 1 wherein two cleaning solution supplying ports are provided in the bottom wall of the cleaning tub, said two ports spaced apart at a predetermined interval, and two current direction changing plates are provided each facing a cleaning solution supplying port.

13. A cleaning device according to claim 1 wherein the current direction changing plate only covers some of the through holes.

14. A method of cleaning semiconductor wafers comprising the steps of:

supplying a cleaning solution to a cleaning tub through the bottom thereof and making the cleaning solution overflow;

inserting a predetermined number of semiconductor wafers held by a wafer transfer means into the cleaning tub;

immersing said semiconductor wafers completely in the demineralized water; and continuously supplying the cleaning solution to the cleaning tub from the bottom thereof through distributing means at a constant rate, thereby cleaning the semiconductor wafers, wherein the step of continuously supplying through distributing means includes providing distributing means having a current regulating plate which is mounted in a bottom portion of said cleaning tub and includes a number of through-holes, and a current direction changing plate which faces a flow of the cleaning solution supplied from the bottom of said cleaning tub and is spaced apart from a lower surface of said current regulating plate.

15. A method of cleaning semiconductor wafers according to claim 14, wherein in the step of continuously supplying the cleaning solution is supplied to the cleaning tub at a rate of at least 0.2 cm/sec.

16. A method of cleaning semiconductor wafers according to claim 14, wherein in the step of inserting the semiconductor wafers into the cleaning tub, the semiconductor wafers are inserted in the cleaning solution in about one second.

17. The method of claim 14, further including providing the current direction changing plate only in the vicinity of a cleaning solution supplying port.

18. A cleaning device comprising:
a cleaning tub;
holding means for holding a plurality of objects substantially vertical at regular intervals;
cleaning solution supplying means for supplying a cleaning solution to said cleaning tub through a bottom thereof; and
distributing means for uniformly distributing the cleaning solution to the objects,
said distributing means comprising two current regulating plates which are mounted in a bottom portion of said cleaning tub, each of said current regulating plates having a number of through-holes, the through-holes in one of said current regulating plates in non-alignment with the through-holes in the other.

19. A cleaning device according to claim 18, wherein said holding means comprises there elongated members arranged parallel to one another, an intermediate member of the three members being positioned lower than the other members on either side thereof so that the objects are held at right angles relative to the members.

20. A cleaning device according to claim 19, wherein said holding means comprises means for supporting and moving said three elongated members up and down so that the objects can be immersed in and lifted out of the cleaning solution in said cleaning tub.

21. A cleaning device comprising:
a cleaning tub;
holding means for holding a plurality of objects substantially vertical at regular intervals;
cleaning solution supplying means having a cleaning solution supplying port for supplying a cleaning solution to said cleaning tub through the bottom thereof; and
distributing means for uniformly distributing the cleaning solution to the objects and creating a flow which flows substantially parallel to the surfaces of the objects;
drain means, formed on the periphery of said cleaning tub, for storing the cleaning solution which overflows said cleaning tub, said drain means having a capacity greater than the amount of the cleaning solution which overflows said cleaning tub when said holding means holding the objects is immersed in the cleaning tub full of the cleaning solution, and said drain means including a discharge port;
pumping means connected between the discharge port of the drain means and the cleaning solution supplying port for supplying the cleaning solution from the drain means to the cleaning tub;
ripple-preventing damping means connected between the pumping means and the cleaning solution supplying port, for damping the cleaning solution from the pumping means; and
filtering means connected between the ripple-preventing damping means and the cleaning solution supplying port, for filtering the cleaning solution from the ripple-preventing damping means.

22. A cleaning device according to claim 21 wherein said pumping means includes a bellows pump and an air supplying section for driving the bellows pump.

* * * * *